(12) United States Patent
Kim

(10) Patent No.: US 6,365,450 B1
(45) Date of Patent: Apr. 2, 2002

(54) FABRICATION OF P-CHANNEL FIELD EFFECT TRANSISTOR WITH MINIMIZED DEGRADATION OF METAL OXIDE GATE

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/809,706

(22) Filed: Mar. 15, 2001

(51) Int. Cl.$^7$ .......................................... H01L 21/8238
(52) U.S. Cl. ...................... 438/216; 438/231; 438/785
(58) Field of Search ................................ 438/216, 231, 438/232, 287, 305, 306, 655, 656, 785

(56) References Cited

U.S. PATENT DOCUMENTS

| | | | | |
|---|---|---|---|---|
| 5,966,597 A | * | 10/1999 | Wright | 438/592 |
| 6,033,963 A | * | 3/2000 | Huang et al. | 438/306 |
| 6,087,208 A | * | 7/2000 | Krivokapic et al. | 438/216 |
| 6,087,231 A | * | 7/2000 | Xiang et al. | 438/287 |

FOREIGN PATENT DOCUMENTS

| JP | 11-251595 | * | 9/1999 |
|---|---|---|---|

* cited by examiner

Primary Examiner—Chandra Chaudhari
(74) Attorney, Agent, or Firm—Monica H. Choi

(57) ABSTRACT

For fabricating a PMOS (P-channel Metal Oxide Semiconductor) field effect transistor on a semiconductor substrate, a PMOS gate dielectric is formed on the semiconductor substrate, and a PMOS dummy gate electrode is formed on the gate dielectric. A P-type dopant is implanted into exposed regions of the semiconductor substrate to form a PMOS drain junction and a PMOS source junction. A thermal anneal is performed to activate the drain and source P-type dopant within the drain and source junctions. A PMOS drain silicide is formed with the drain junction, and a PMOS source silicide is formed with the source junction, in a silicidation process. An insulating material is deposited to surround the dummy gate electrode and the gate dielectric. The dummy gate electrode is etched away to form a PMOS gate electrode opening surrounded by the insulating material. The gate electrode opening is filled with a metal oxide material to form a PMOS metal oxide gate electrode after the thermal anneal process for activating the drain and source P-type dopant within the drain and source junctions and after the silicidation process for forming the drain and source silicides, to minimize degradation of the metal oxide gate electrode. In another aspect of the present invention, an insulating material is deposited on top of the metal oxide gate electrode to encapsulate the metal oxide gate electrode before performing a thermal anneal with hydrogen gas to prevent exposure of the metal oxide gate electrode to the hydrogen gas to further minimize degradation of the metal oxide gate electrode.

15 Claims, 7 Drawing Sheets

FABRICATION OF P-CHANNEL FIELD EFFECT TRANSISTOR WITH MINIMIZED DEGRADATION OF METAL OXIDE GATE

TECHNICAL FIELD

The present invention relates generally to fabrication of field effect transistors having scaled-down dimensions, and more particularly, to a process for fabricating a P-channel field effect transistor having a metal oxide gate and a gate dielectric with a high dielectric constant while minimizing degradation of the metal oxide gate.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100. The drain and source extension junctions 104 and 106 and the drain and source contact junctions 108 and 112 are doped with an N-type dopant for an NMOSFET (N-channel Metal Oxide Semiconductor Field Effect Transistor) and with a P-type dopant for a PMOSFET (P-channel Metal Oxide Semiconductor Field Effect Transistor).

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, short-channel effects degrade the performance of the MOSFET 100. Short-channel effects that result due to the short length of the channel between the drain extension junction 104 and the source extension junction 106 of the MOSFET 100 are known to one of ordinary skill in the art of integrated circuit fabrication. The electrical characteristics of the MOSFET 100 become difficult to control with bias on the gate electrode 118 with short-channel effects which may severely degrade the performance of the MOSFET.

Conventionally, the gate dielectric 116 for the MOSFET 100 is typically comprised of silicon dioxide ($SiO_2$), and the gate electrode 118 is typically comprised of polysilicon. As the channel length and width dimensions of the MOSFET 100 are scaled down for enhanced speed performance, the thicknesses of the gate dielectric 116 and the gate electrode 118 are also correspondingly scaled down, as known to one of ordinary skill in the art of integrated circuit fabrication. However, as the channel length and width dimensions of the MOSFET 100 are scaled down to tens of nanometers, the thickness of the gate dielectric 116 is also scaled down to tens of angstroms when the gate dielectric 116 is comprised of silicon dioxide ($SiO_2$). With such a thin gate dielectric 116, charge carriers easily tunnel through the gate dielectric 116, as known to one of ordinary skill in the art of integrated circuit fabrication.

When charge carriers tunnel through the gate dielectric 116, gate leakage current undesirably increases resulting in increased static power dissipation and even circuit malfunction. In addition, with charge carriers tunneling through the gate dielectric 116, decreased charge carrier accumulation in the channel of the MOSFET may result in undesirable increase in resistance through the channel of the MOSFET. Furthermore, with the thin gate dielectric 116, charge accumulation at the gate electrode 118 causes an undesirable increase in charge carrier scattering at the surface of the channel of the MOSFET 100. Such increase in charge carrier scattering in turn results in higher resistance through the channel of the MOSFET.

In light of these disadvantages of the thin gate dielectric 116 when the gate dielectric 116 is comprised of silicon dioxide ($SiO_2$), referring to FIG. 2, a MOSFET (Metal Oxide Semiconductor Field Effect Transistor) 150 has a gate dielectric 152 comprised of a dielectric material having a dielectric constant that is higher than the dielectric constant of silicon dioxide ($SiO_2$) (i.e., a high dielectric constant material) when the MOSFET 150 has scaled down dimensions of tens of nanometers. Device structures having the same reference number in FIGS. 1 and 2 refer to elements having similar structure and function. A dielectric material having a higher dielectric constant has higher thickness for achieving the same capacitance. Thus, when the gate dielectric 152 is comprised of a high dielectric constant material, the gate dielectric 152 has a higher thickness (hundreds of angstroms) than when the gate dielectric is comprised of silicon dioxide ($SiO_2$) (tens of angstroms), for field effect transistors having scaled down dimensions of tens of nanometers.

The gate dielectric 152 with high dielectric constant has higher thickness to minimize charge carrier tunneling through the gate dielectric 152 for field effect transistors having scaled down dimensions of tens of nanometers. Charge carrier tunneling through the gate dielectric 152 is minimized exponentially by the thickness of the gate dielectric. Dielectric materials having a dielectric constant that is higher than the dielectric constant of silicon dioxide ($SiO_2$) are known to one of ordinary skill in the art of integrated circuit fabrication.

However, typical dielectric materials having a dielectric constant that is higher than the dielectric constant of silicon dioxide ($SiO_2$) react with the polysilicon gate at temperatures above about 800° Celsius. Thus, referring to FIG. 2, a metal gate electrode 154 is formed instead of a polysilicon gate electrode for an NMOSFET. A metal gate electrode 154 comprised of one of aluminum, molybdenum, platinum, or tantalum is advantageous for an NMOSFET. When such a metal is used for the gate electrode of an NMOSFET, the gate electrode of a PMOSFET is advantageously comprised of a metal oxide including one of ruthenium oxide ($RuO_2$) or iridium oxide ($IrO_2$) for proper work function relations between the NMOSFET and the PMOSFET. The gate dielectric 152 comprised of a dielectric material having a dielectric constant that is higher than the dielectric constant of silicon dioxide ($SiO_2$) is less likely to react with the metal gate electrode 154 of the NMOSFET.

Nevertheless, the gate electrode comprised of metal oxide for the PMOSFET may still react with the high dielectric constant material of the gate dielectric at temperatures above about 800° Celsius. A thermal anneal process for activating dopant within the drain and source junctions of the field effect transistor and a silicidation process for forming drain and source silicides uses temperatures above about 1000° Celsius. In addition, a thermal anneal with hydrogen gas ($H_2$) is performed toward the end of the process for fabricating integrated circuits to strengthen the reliability of dielectric materials of the integrated circuit, as known to one of ordinary skill in the art of integrated circuit fabrication. When the gate electrode is comprised of a metal oxide for the PMOSFET, the hydrogen may react with the metal oxide of the gate electrode for the PMOSFET to degrade the gate electrode.

Thus, a mechanism is desired for forming a gate electrode comprised of metal oxide for the PMOSFET and a gate electrode comprised of metal for the NMOSFET with minimized degradation of the gate electrode comprised of metal oxide for the PMOSFET.

SUMMARY OF THE INVENTION

Accordingly, in a general aspect of the present invention, the gate electrode comprised of metal oxide for the PMOSFET is formed after the thermal anneal process for activating dopant within the drain and source junctions of the field effect transistor and after the silicidation process for forming drain and source silicides. In addition, an insulating material is deposited to encapsulate the gate electrode comprised of metal oxide for the PMOSFET before the thermal anneal using hydrogen gas ($H_2$) to prevent contact of the hydrogen gas with the gate electrode comprised of metal oxide for the PMOSFET.

In one embodiment of the present invention, for fabricating a PMOS (P-channel Metal Oxide Semiconductor) field effect transistor on a semiconductor substrate, a layer of gate dielectric material is deposited on the semiconductor substrate, and a layer of dummy gate electrode material is deposited on the layer of gate dielectric material. The layer of gate dielectric material and the layer of dummy gate electrode material are patterned over a first active device area of the semiconductor substrate to form a PMOS (P-channel Metal Oxide Semiconductor) gate dielectric from the gate dielectric material and to form a PMOS (P-channel Metal Oxide Semiconductor) dummy gate electrode from the dummy gate electrode material. A drain and source P-type dopant is implanted into exposed regions of the first active device area of the semiconductor substrate to form a PMOS (P-channel Metal Oxide Semiconductor) drain junction and a PMOS (P-channel Metal Oxide Semiconductor) source junction. A thermal anneal is performed to activate the drain and source P-type dopant within the PMOS drain and source junctions. A PMOS (P-channel Metal Oxide Semiconductor) drain silicide is formed with the PMOS drain junction, and a PMOS (P-channel Metal Oxide Semiconductor) source silicide is formed with the PMOS source junction, in a silicidation process.

In addition, an insulating material is deposited to surround the PMOS dummy gate electrode and the PMOS gate dielectric. The PMOS dummy gate electrode is etched away to form a PMOS (P-channel Metal Oxide Semiconductor) gate electrode opening surrounded by the insulating material. The PMOS gate electrode opening is filled with a metal oxide material to form a PMOS metal oxide gate electrode after the thermal anneal process for activating the drain and source P-type dopant within the PMOS drain and source junctions and after the silicidation process for forming the drain and source silicides. The thermal anneal process for activating the drain and source P-type dopant within the PMOS drain and source junctions and the silicidation process for forming the drain and source silicides may use temperatures above about 1000° Celsius. Such high temperature processes are performed with the dummy gate electrode, and the PMOS metal oxide gate electrode is formed after such high temperature processes. In this manner, the PMOS metal oxide gate electrode is not heated up to such high temperatures to minimize degradation of the PMOS metal oxide gate electrode.

In another aspect of the present invention, an insulating material is deposited on top of the PMOS metal oxide gate electrode to encapsulate the PMOS metal oxide gate electrode before performing a thermal anneal with hydrogen gas. Thus, the PMOS metal oxide gate electrode is encapsulated to prevent exposure of the PMOS metal oxide gate electrode to the hydrogen gas to minimize degradation of the PMOS metal oxide gate electrode.

In a further aspect of the present invention, an NMOS (N-channel Metal Oxide Semiconductor) field effect transistor is also fabricated by patterning the layer of gate dielectric material and the layer of dummy gate electrode material over a second active device area of the semiconductor substrate to form an NMOS (N-channel Metal Oxide Semiconductor) gate dielectric from the gate dielectric material and to form an NMOS (N-channel Metal Oxide Semiconductor) dummy gate electrode from the dummy gate electrode material. A drain and source N-type dopant is implanted into exposed regions of the second active device area of the semiconductor substrate to form an NMOS (N-channel Metal Oxide Semiconductor) drain junction and an NMOS (N-channel Metal Oxide Semiconductor) source junction.

A thermal anneal process is performed to activate the drain and source N-type dopant within the NMOS drain and source junctions. An NMOS (N-channel Metal Oxide Semiconductor) drain silicide is formed with the NMOS drain junction, and an NMOS (N-channel Metal Oxide Semiconductor) source silicide is formed with the NMOS source junction, in a silicidation process. The thermal anneal process for activating the drain and source N-type dopant within the NMOS drain and source junctions and the silicidation process for forming silicides of the NMOSFET are performed before the PMOS metal oxide gate electrode is formed to minimize degradation of the PMOS metal oxide gate electrode.

An insulating material is deposited to surround the NMOS dummy gate electrode and the NMOS gate dielectric. The NMOS dummy gate electrode is etched away to form an NMOS (N-channel Metal Oxide Semiconductor) gate electrode opening surrounded by the insulating material. The NMOS gate electrode opening is filled with a metal material to form an NMOS metal gate electrode.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, and 20 refer to elements having similar structure and function.

DETAILED DESCRIPTION

Figure 1:
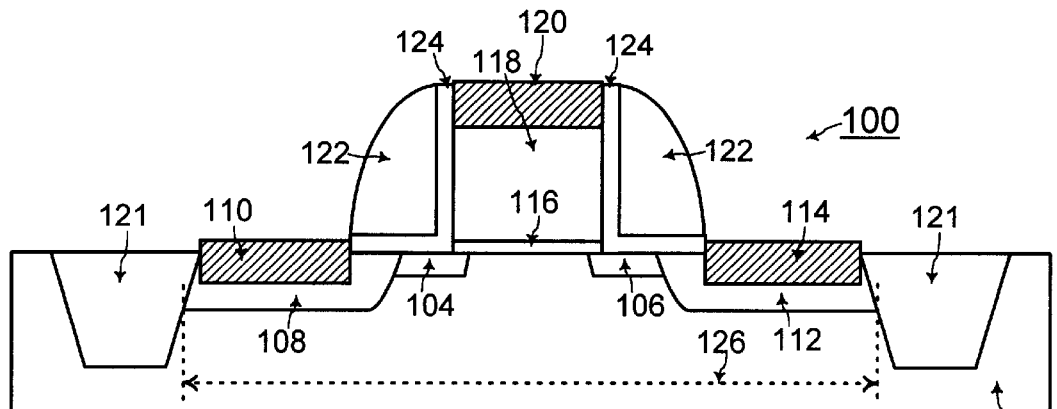
FIG. 1 shows a cross-sectional view of a conventional MOSFET (Metal Oxide Semiconductor Field Effect Transistor) having a polysilicon gate and a gate dielectric comprised of silicon dioxide ($SiO_2$), according to the prior art.
Figure 2:
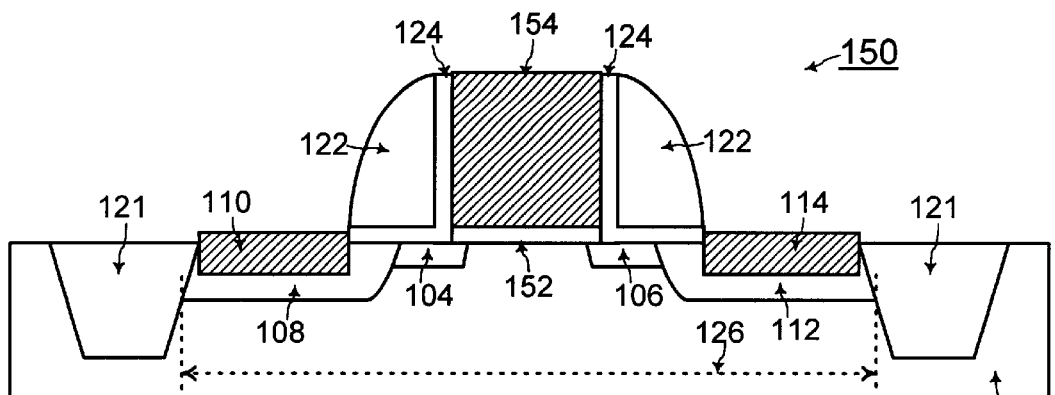
FIG. 2 shows a cross-sectional view of a conventional NMOSFET having a gate dielectric comprised of a high dielectric constant material and having a metal gate electrode, according to the prior art.
Figure 3:
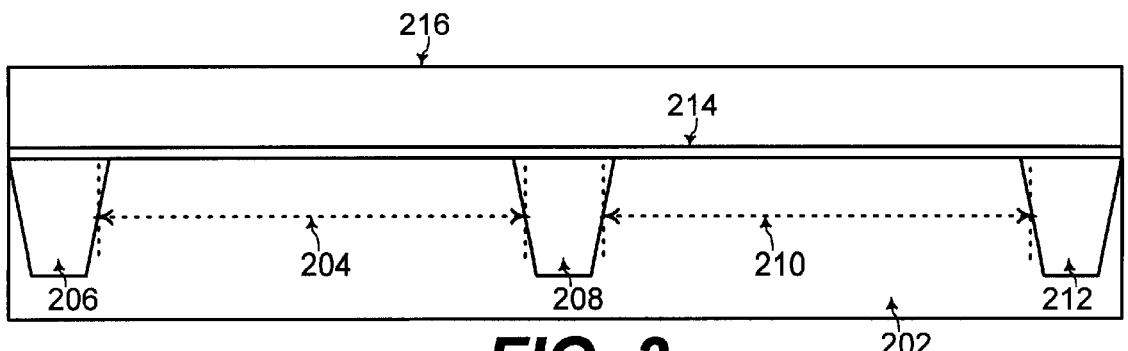
FIGS. 3, 4, 5, 6, 7, 8, 9, 10, 11, 12, 13, 14, 15, and 16 show cross-sectional views for illustrating the steps for fabricating a PMOSFET (P-channel Metal Oxide Semiconductor Field Effect Transistor) having a gate electrode comprised of metal oxide and an NMOSFET (N-channel Metal Oxide Semiconductor Field Effect Transistor) having a gate electrode comprised of metal, with minimized degradation of the gate electrode comprised of metal oxide for the PMOSFET, according to one embodiment of the present invention.

Referring to FIG. 3, a PMOSFET (P-channel Metal Oxide Semiconductor Field Effect Transistor) and an NMOSFET (N-channel Metal Oxide Semiconductor Field Effect Transistor) are formed on a semiconductor substrate 202 which is comprised of silicon in one embodiment of the present invention. A PMOSFET is to be formed on a first active device area 204 defined by a first shallow trench isolation structure 206 and a second shallow trench isolation structure 208. An NMOSFET is to be formed on a second active device area 210 defined by the second shallow trench isolation structure 208 and a third shallow trench isolation structure 212. Processes for formation of shallow trench isolation structures for electrically isolating integrated circuit devices within a semiconductor substrate are known to one of ordinary skill in the art of integrated circuit fabrication.

Further referring to FIG. 3, a layer of gate dielectric material 214 is formed on the semiconductor substrate 202. The layer of gate dielectric material 214 is comprised of a high dielectric constant material having a dielectric constant higher than that of silicon dioxide ($SiO_2$) in one embodiment of the present invention. Such high dielectric constant materials and processes for depositing such high dielectric constant materials are known to one of ordinary skill in the art of integrated circuit fabrication.

Further referring to FIG. 3, a layer of dummy gate electrode material 216 comprised of an insulating material is deposited on the layer of gate dielectric material 214. In one embodiment of the present invention, the layer of dummy gate electrode material 216 is comprised of silicon nitride ($Si_3N_4$). Processes for depositing such a layer of dummy gate electrode material 216 are known to one of ordinary skill in the art of integrated circuit fabrication.

Figure 4:
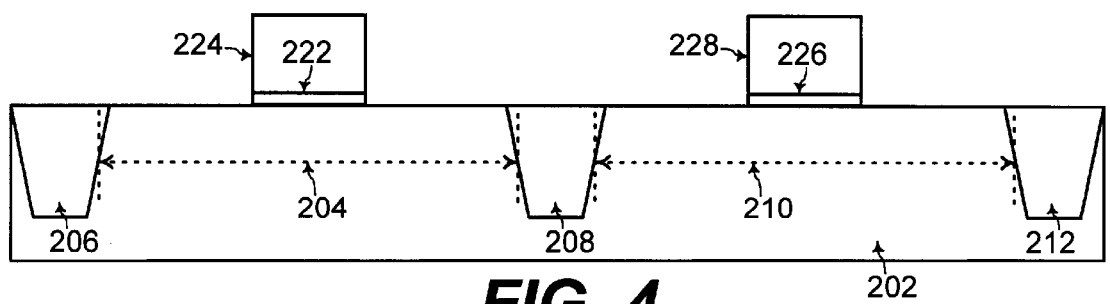

Referring to FIG. 4, the layer of dummy gate electrode material 216 and the layer of gate dielectric material 214 over the first active device area 204 of the semiconductor substrate 202 are patterned to form a PMOS (P-channel Metal Oxide Semiconductor) gate dielectric 222 and to form a PMOS (P-channel Metal Oxide Semiconductor) dummy gate electrode 224. The PMOS gate dielectric 222 is comprised of the gate dielectric material 214, and the PMOS dummy gate electrode 224 is comprised of the dummy gate electrode material 216. The PMOS gate dielectric 222 and the PMOS dummy gate electrode 224 are patterned to be disposed over the first active device area 204 of the semiconductor substrate 202 such that portions of the first active device area 204 of the semiconductor substrate 202 are exposed. Processes for patterning the layer of dummy gate electrode material 216 and the layer of gate dielectric material 214 are known to one of ordinary skill in the art of integrated circuit fabrication.

Further referring to FIG. 4, the layer of dummy gate electrode material 216 and the layer of gate dielectric material 214 over the second active device area 210 of the semiconductor substrate 202 are patterned to form an NMOS (N-channel Metal Oxide Semiconductor) gate dielectric 226 and to form an NMOS (N-channel Metal Oxide Semiconductor) dummy gate electrode 228. The NMOS gate dielectric 226 is comprised of the gate dielectric material 214, and the NMOS dummy gate electrode 228 is comprised of the dummy gate electrode material 216. The NMOS gate dielectric 226 and the NMOS dummy gate electrode 228 are patterned to be disposed over the second active device area 210 of the semiconductor substrate 202 such that portions of the second active device area 210 of the semiconductor substrate 202 are exposed. Processes for patterning the layer of dummy gate electrode material 216 and the layer of gate dielectric material 214 are known to one of ordinary skill in the art of integrated circuit fabrication.

Figure 5:
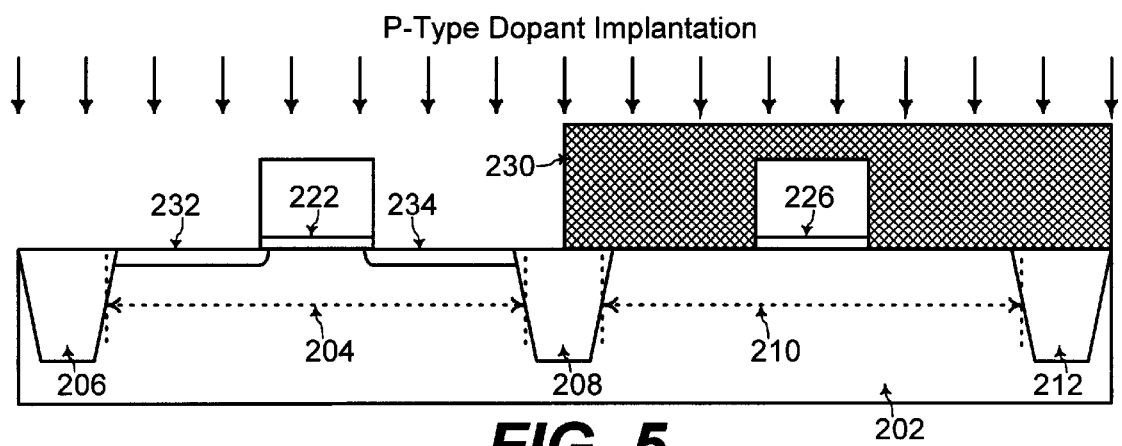

Referring to FIG. 5, an NMOS (N-channel Metal Oxide Semiconductor) masking structure 230 is formed to cover the NMOS gate electrode 226 and the second active device area 210 of the semiconductor substrate 202. Processes for forming the masking structure 230 which may be comprised of photoresist according to one embodiment of the present invention are known to one of ordinary skill in the art of integrated circuit fabrication.

Further referring to FIG. 5, according to one embodiment of the present invention, a drain and source P-type dopant is implanted into the exposed regions of the first active device area 204 of the semiconductor substrate 202 to form a PMOS (P-channel Metal Oxide Semiconductor) drain junction 232 and a PMOS (P-channel Metal Oxide Semiconductor) source junction 234. The masking structure 230 blocks the drain and source P-type dopant from being implanted into the second active device area 210 of the semiconductor substrate 202. Processes for implanting the drain and source P-type dopant which is comprised of boron according to one embodiment of the present invention are known to one of ordinary skill in the art of integrated circuit fabrication.

Figure 6:
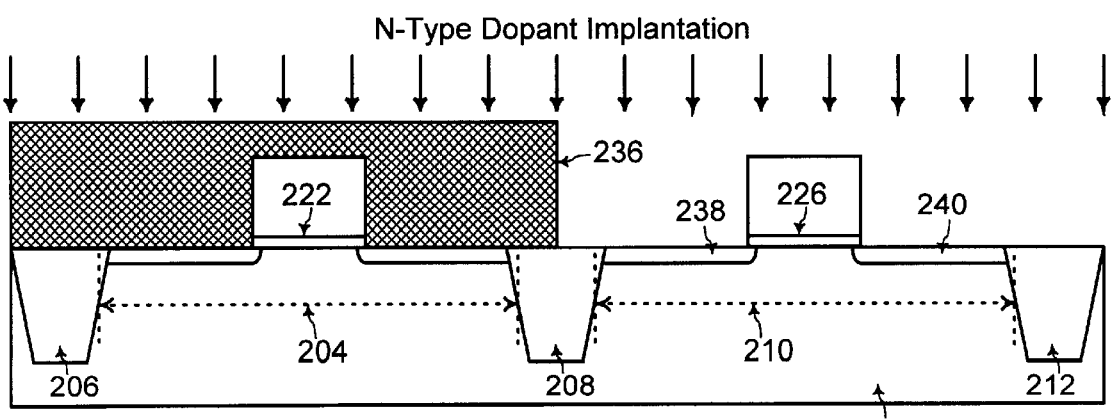

Referring to FIG. 6, the NMOS masking structure 230 is etched away, and a PMOS (P-channel Metal Oxide Semiconductor) masking structure 236 is formed to cover the PMOS gate electrode 224 and the first active device area 204 of the semiconductor substrate 202. Processes for etching away the NMOS masking structure 230 and for forming the PMOS masking structure 236 which may be comprised of photoresist according to one embodiment of the present invention are known to one of ordinary skill in the art of integrated circuit fabrication.

Further referring to FIG. 6, according to one embodiment of the present invention, a drain and source N-type dopant is implanted into the exposed regions of the second active device area 210 of the semiconductor substrate 202 to form an NMOS (N-channel Metal Oxide Semiconductor) drain junction 238 and an NMOS (N-channel Metal Oxide Semiconductor) source junction 240. The masking structure 236 blocks the drain and source N-type dopant from being implanted into the first active device area 204 of the semiconductor substrate 202. Processes for implanting the drain and source N-type dopant which is comprised of phosphorous according to one embodiment of the present invention are known to one of ordinary skill in the art of integrated circuit fabrication.

Figure 7:
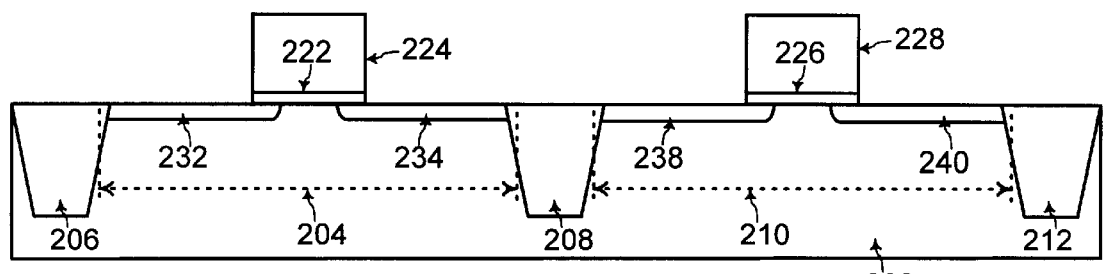

Referring to FIG. 7, the PMOS masking structure 236 is etched away. Referring to FIG. 7, the P-type dopant within the PMOS drain and source junctions 232 and 234 and the N-type dopant within the NMOS drain and source junctions 238 and 240 are activated in a thermal anneal process using a temperature great than about 1000° Celsius for example according to one embodiment of the present invention. Thermal anneal processes for activating dopant are known to one of ordinary skill in the art of integrated circuit fabrication.

Figure 8:
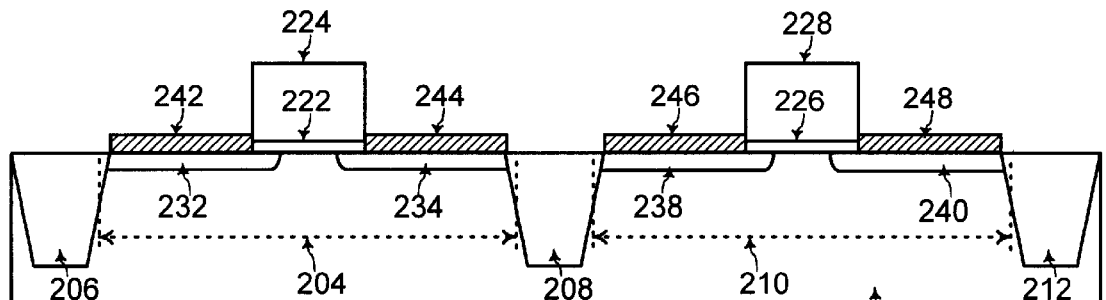

Referring to FIG. 8, a PMOS (P-channel Metal Oxide Semiconductor) drain silicide 242 is formed with the PMOS drain junction 232, and a PMOS (P-channel Metal Oxide Semiconductor) source silicide 244 is formed with the PMOS source junction 234. In addition, an NMOS (N-channel Metal Oxide Semiconductor) drain silicide 246 is formed with the NMOS drain junction 238, and an NMOS (N-channel Metal Oxide Semiconductor) source silicide 248 is formed with the NMOS source junction 240. The drain and source silicides 242, 244, 246, and 248 are formed in a silicidation process using a temperature above about 1000° Celsius for example according to one embodiment of the present invention. Silicides 242, 244, 246, and 248 are formed from deposition of a metal and a reaction of such metal with the silicon of the drain and source junctions 232, 234, 238, and 240, to provide low resistance contact to the drain and source junctions 232, 234, 238, and 240. Silicidation processes for forming silicides 242, 244, 246, and 248 are known to one of ordinary skill in the art of integrated circuit fabrication.

Figure 9:
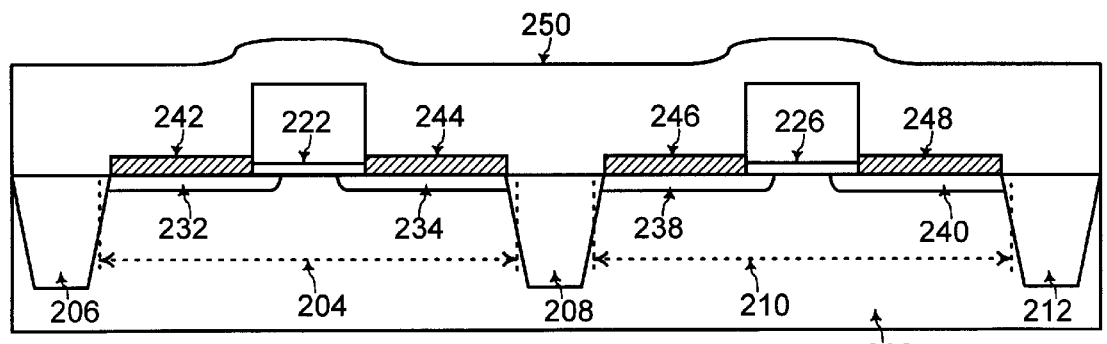

Referring to FIG. 9, a layer of insulating material 250 is conformally deposited to cover the PMOS dummy gate electrode 224 and the NMOS dummy gate electrode 228. The layer of insulating material 250 is comprised of silicon dioxide ($SiO_2$) according to one embodiment of the present invention. Processes for conformally depositing such a layer of insulating material 250 are known to one of ordinary skill in the art of integrated circuit fabrication.

Figure 10:
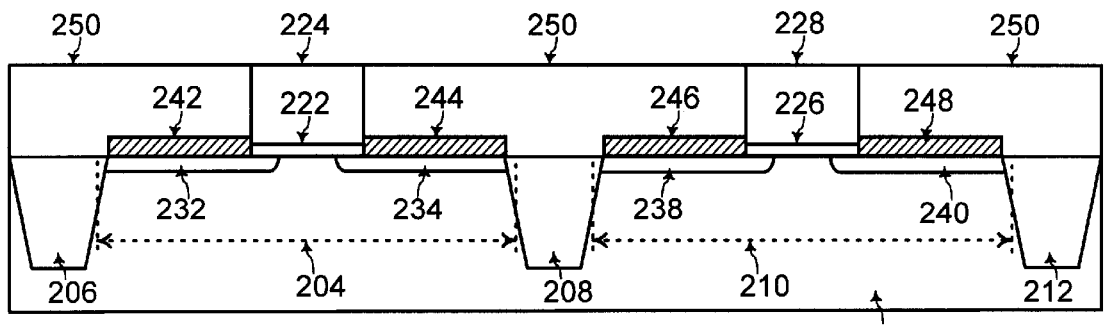

Referring to FIG. 10, the layer of insulating material 250 is polished down until the PMOS dummy gate electrode 224 and the NMOS dummy gate electrode 228 are exposed such that the insulating material 250 surrounds the sidewalls of the PMOS dummy gate electrode 224 and the NMOS dummy gate electrode 228. Processes, such as CMP (chemical mechanical polishing) processes, for polishing down the layer of insulating material 250 which may be comprised of silicon dioxide ($SiO_2$) according to one embodiment of the present invention are known to one of ordinary skill in the art of integrated circuit fabrication.

Figure 11:
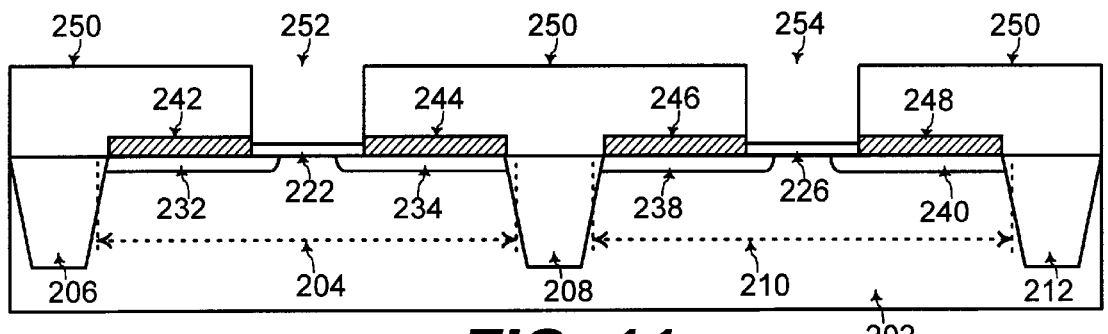

Referring to FIG. 11, the PMOS dummy gate electrode 224 and the NMOS dummy gate electrode 228 which are comprised of silicon nitride ($Si_3N_4$) according to one embodiment of the present invention are selectively etched away to form a PMOS (P-channel Metal Oxide Semiconductor) gate opening 252 and an NMOS (N-channel Metal Oxide Semiconductor) gate opening 254. The PMOS gate opening 252 is formed from the PMOS dummy gate electrode 224 being etched away and has the PMOS gate dielectric 222 at the bottom of the PMOS gate opening 252. The NMOS gate opening 254 is formed from the NMOS dummy gate electrode 228 being etched away and has the NMOS gate dielectric 226 at the bottom of the NMOS gate opening 254. Processes for selectively etching away the silicon nitride ($Si_3N_4$) of the PMOS dummy gate electrode 224 and the NMOS dummy gate electrode 228 are known to one of ordinary skill in the art of integrated circuit fabrication.

Figure 12:
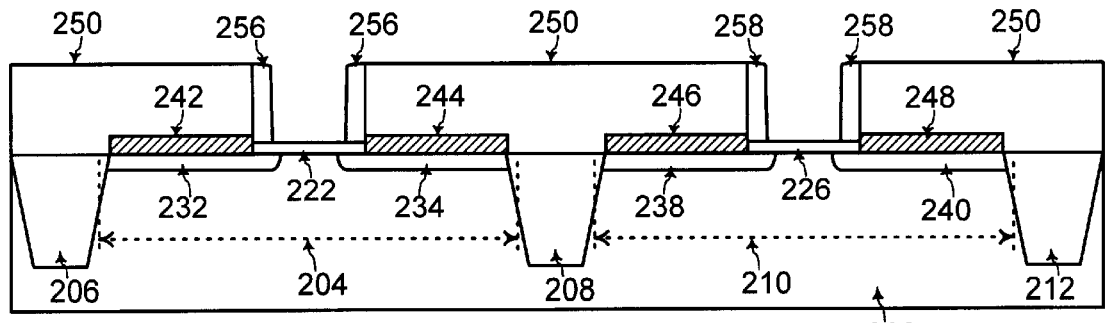

Referring to FIG. 12, PMOS (P-channel Metal Oxide Semiconductor) spacers 256 comprised of silicon dioxide ($SiO_2$) according to one embodiment of the present invention are formed at sidewalls of the PMOS gate opening 252. In addition, NMOS (N-channel Metal Oxide Semiconductor) spacers 258 comprised of silicon dioxide ($SiO_2$) according to one embodiment of the present invention are formed at sidewalls of the NMOS gate opening 254. Processes, such as depositing silicon dioxide ($SiO_2$) within the gate openings 252 and 254 and anisotropically etching the silicon dioxide ($SiO_2$) within the gate openings 252 and 254, to form the spacers 256 and 258 are known to one of ordinary skill in the art of integrated circuit fabrication.

Figure 13:
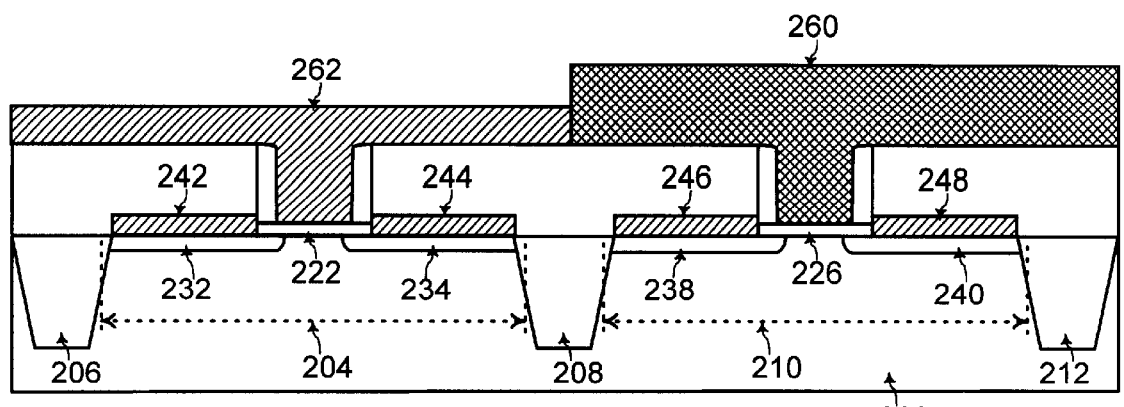

Referring to FIG. 13, an NMOS (N-channel Metal Oxide Semiconductor) gate opening masking structure 260 is formed over the second active device area 210 of the semiconductor substrate 202. The NMOS gate opening masking structure 260 is comprised of photoresist material according to one embodiment of the present invention, and processes for forming such an NMOS gate opening masking structure 260 are known to one of ordinary skill in the art of integrated circuit fabrication.

A metal oxide material 262 is deposited to fill the PMOS gate opening 252. The metal oxide material 262 filling the PMOS gate opening 252 is comprised of one of ruthenium oxide (RuO2) or iridium oxide (IrO2) according to one embodiment of the present invention. The NMOS gate opening masking structure 260 prevents the metal oxide material 262 from filling the NMOS gate opening 254. Processes for depositing such a metal oxide material 262 to fill the PMOS gate opening 252 are known to one of ordinary skill in the art of integrated circuit fabrication.

Figure 14:
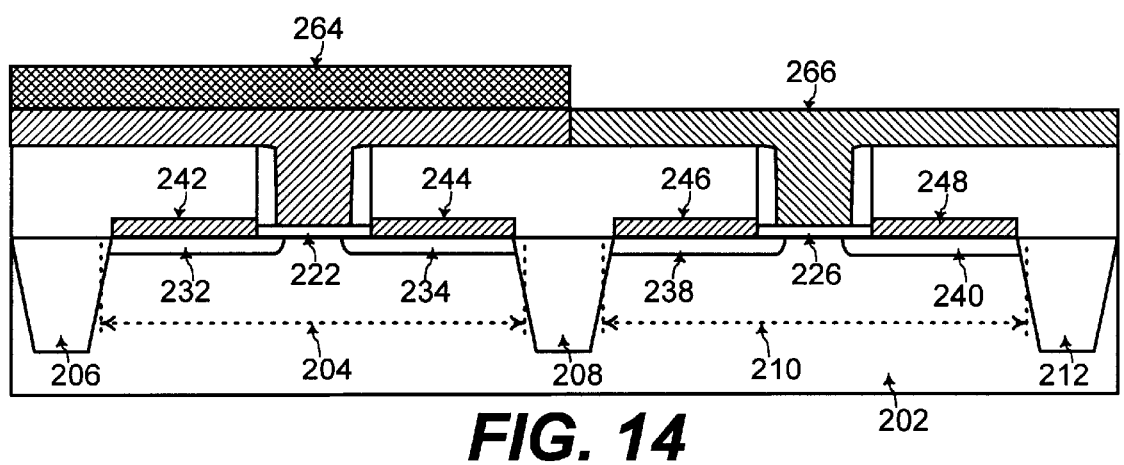

Referring to FIG. 14, the NMOS gate opening masking structure 260 is etched away to expose the NMOS gate opening 254. Processes for etching away the NMOS gate opening masking structure 260 which is comprised of photoresist material according to one embodiment of the present invention are known to one ordinary skill in the art of integrated circuit fabrication.

In addition, a PMOS (P-channel Metal Oxide Semiconductor) gate opening masking structure 264 is formed over the first active device area 204 of the semiconductor substrate 202. A metal material 266 is deposited to fill the NMOS gate opening 254. The metal material 266 filling the NMOS gate opening 254 is comprised one of aluminum, molybdenum, platinum, or tantalum according to one embodiment of the present invention. The PMOS gate opening masking structure 264 prevents the metal material 266 from forming over the first active device area 204 of the semiconductor substrate 202. Processes for depositing such a metal material 266 to fill the NMOS gate opening 254 are known to one of ordinary skill in the art of integrated circuit fabrication.

Figure 15:
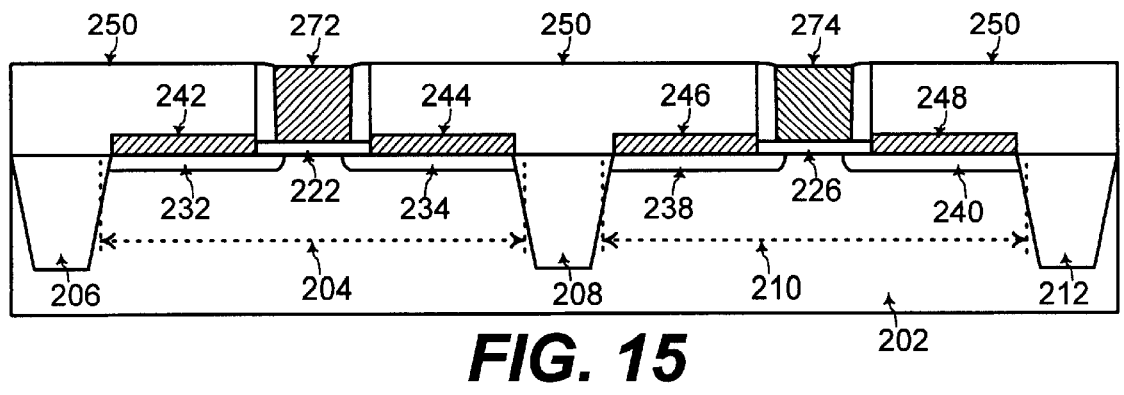

Referring to FIG. 15, the PMOS gate opening masking structure 264 is etched away to expose the metal oxide material 262. Processes for etching away the PMOS gate opening masking structure 264 which is comprised of photoresist material according to one embodiment of the present invention are known to one ordinary skill in the art of integrated circuit fabrication.

Further referring to FIG. 15, a top portion of the metal oxide material 262 and the metal material 266 are etched away until the metal oxide material 262 is contained within the PMOS gate opening 252 to form a PMOS (P-channel Metal Oxide Semiconductor) metal oxide gate electrode 272 and until the metal material 266 is contained within the NMOS gate opening 254 to form an NMOS (N-channel Metal Oxide Semiconductor) metal gate electrode 274. The PMOS metal oxide gate electrode 272 is comprised of the metal oxide material 262 contained within the PMOS gate opening 252, and the NMOS metal gate electrode 274 is comprised of the metal material 266 contained within the NMOS gate opening 254. Processes for etching away the top portion of the metal oxide material 262 and the metal material 266 to form the PMOS metal oxide gate electrode 272 and the NMOS metal gate electrode 274 are known to one ordinary skill in the art of integrated circuit fabrication.

Referring to FIGS. 12 and 15, the PMOS spacers 256 formed at the sidewalls of the PMOS gate opening 252 reduce the channel length of the PMOSFET. Similarly, the NMOS spacers 258 formed at the sidewalls of the NMOS gate opening 254 reduce the channel length of the NMOSFET.

Figure 16:
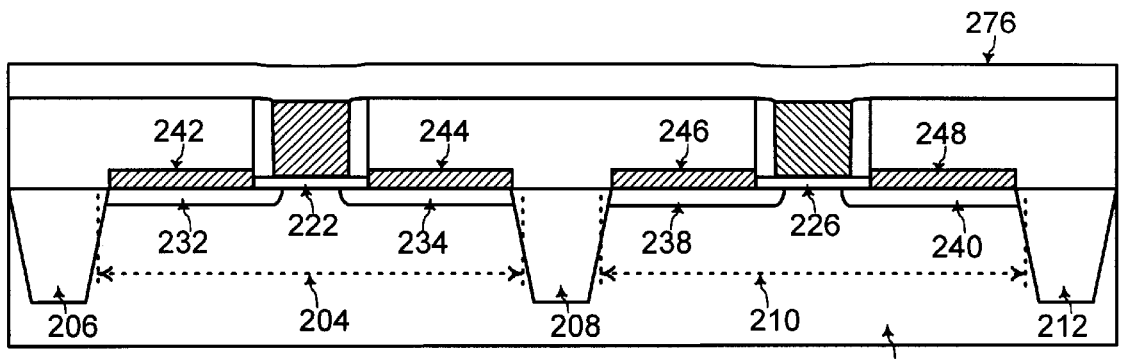

Referring to FIG. 16, an insulating material 276 is deposited on top of the PMOS metal oxide gate electrode 272 and the NMOS metal gate electrode 274 to encapsulate the PMOS metal oxide gate electrode 272 and the NMOS metal gate electrode 274. A thermal anneal with hydrogen gas ($H_2$) flowing through the thermal anneal chamber is performed to strengthen the reliability of dielectric materials of the integrated circuit having the PMOS metal oxide gate electrode 272 and the NMOS metal gate electrode 274. Such a thermal anneal process is known to one ordinary skill in the art of integrated circuit fabrication. The hydrogen gas ($H_2$) may react with the PMOS metal oxide gate electrode 272 to degrade the PMOS metal oxide gate electrode 272 if hydrogen gas ($H_2$) were to contact the PMOS metal oxide gate electrode 272 during such a thermal anneal process. The insulating material 276 encapsulates the PMOS metal oxide gate electrode 272 to prevent contact of the hydrogen gas ($H_2$) with the PMOS metal oxide gate electrode 272 to minimize degradation of the PMOS metal oxide gate electrode 272 during such a thermal anneal process.

In this manner, the PMOS dummy gate electrode 224 and the NMOS dummy gate electrode 228 are used during the thermal anneal process for activating dopant within the drain and source junctions and during the silicidation process for forming the drain and source silicides. The thermal anneal process for activating dopant within the drain and source junctions and the silicidation process for forming the drain and source silicides may use relatively high temperatures above about 1000° Celsius. Such relatively high temperatures may degrade the PMOS gate electrode 272 comprised of metal oxide such as ruthenium oxide ($RuO2$) or iridium oxide ($IrO2$) for example.

Thus, in an aspect of the present invention, the PMOS metal oxide gate electrode 272 and the NMOS metal gate electrode 274 are formed after the thermal anneal process for activating dopant within the drain and source junctions and after the silicidation process for forming the drain and source silicides, to minimize degradation of the PMOS metal oxide gate electrode 272. In addition, the insulating material 276 encapsulates the PMOS metal oxide gate electrode 272 to prevent contact of the hydrogen gas ($H_2$) with the PMOS metal oxide gate electrode 272 to minimize degradation of the PMOS metal oxide gate electrode 272 during a thermal anneal process having hydrogen gas ($H_2$) flowing through the thermal anneal chamber.

According to another embodiment of the present invention, referring to FIGS. 3 and 4, the layer of gate dielectric material 214 is comprised of a dummy gate dielectric material such as silicon dioxide ($SiO_2$) for example. In that case, the PMOS gate dielectric 222 is a PMOS dummy gate dielectric 222 comprised of the dummy gate dielectric material 214, and the NMOS gate dielectric 226 is an NMOS dummy gate dielectric 226 comprised of the dummy gate dielectric material 214.

Figure 17:
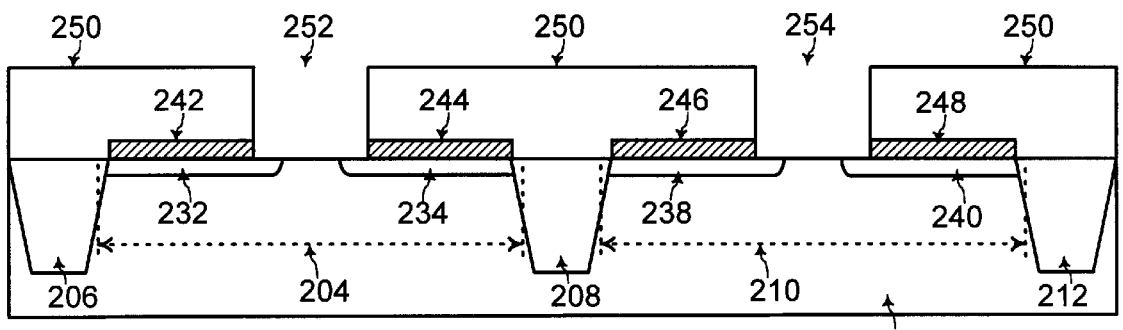
FIGS. 17, 18, 19, and 20 show cross-sectional views for illustrating the steps for etching away a dummy gate dielectric from a gate electrode opening and forming a gate dielectric comprised of a high dielectric constant material at the bottom of the gate electrode opening after the thermal anneal process for activating the drain and source dopant within the drain and source junctions and after the silicidation process for forming the drain and source silicides, to minimize degradation of the gate dielectric, according to another embodiment of the present invention.

Referring to FIGS. 11 and 17, in this alternative embodiment of the present invention, after the PMOS dummy gate electrode 224 and the NMOS dummy gate electrode 228 are etched away, the PMOS dummy gate dielectric 222 and the NMOS dummy gate dielectric 226 are etched away. Thus, the semiconductor substrate 202 is exposed at the bottom of the PMOS gate electrode opening 252 and at the bottom of the NMOS gate electrode opening 254. Processes for etching away the PMOS dummy gate dielectric 222 and the NMOS dummy gate dielectric 226 which are comprised of silicon dioxide ($SiO_2$) according to one embodiment of the present invention are known to one of ordinary skill in the art of integrated circuit fabrication.

Figure 18:
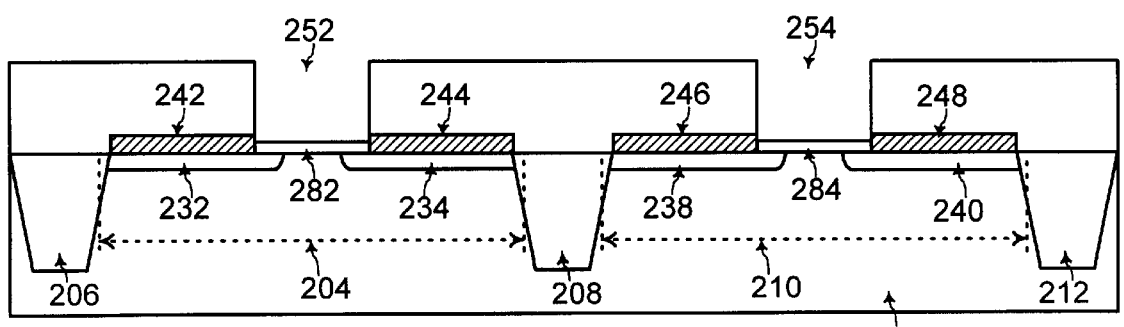

Referring to FIG. 18, a PMOS gate dielectric 282 is formed on the semiconductor substrate 202 at the bottom of the PMOS gate opening 252. Similarly, an NMOS gate dielectric 284 is formed on the semiconductor substrate 202 at the bottom of the NMOS gate opening 254. The PMOS gate dielectric 282 and the NMOS gate dielectric 284 are comprised of a high dielectric constant material (i.e. having a dielectric constant higher than that of silicon dioxide ($SiO_2$)).

Figure 19:
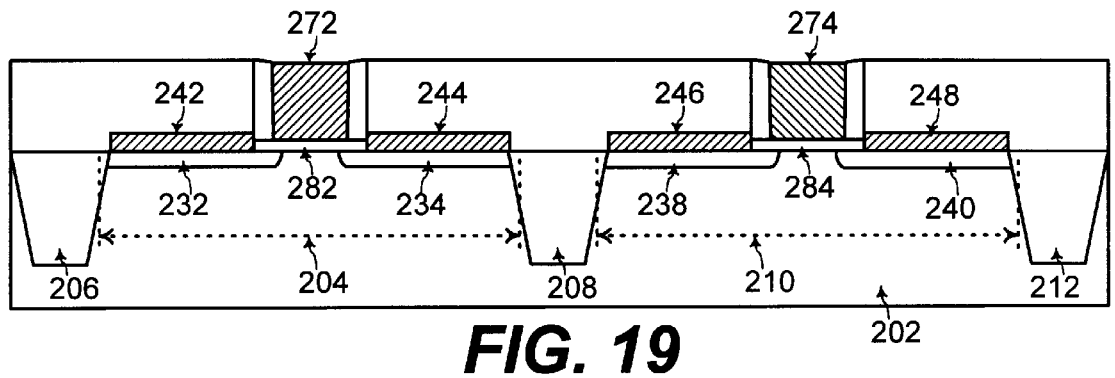
Figure 20:
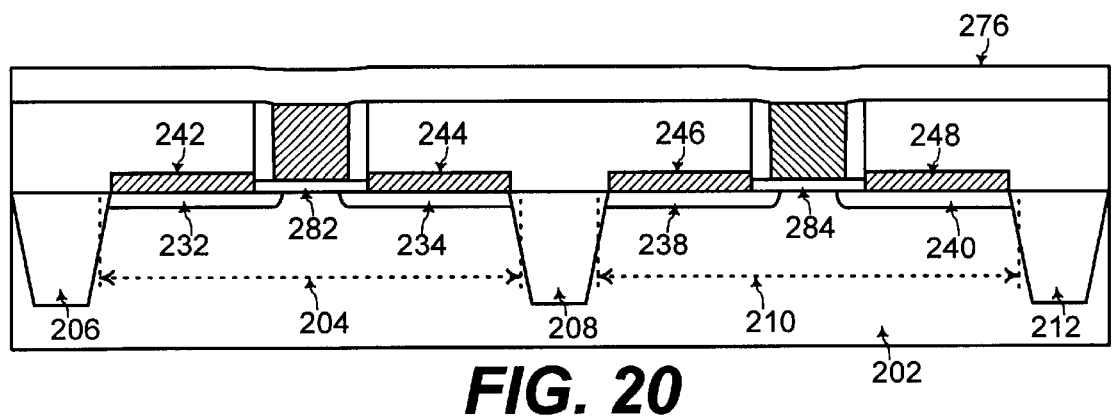

Referring to FIG. 19, the PMOS metal oxide gate electrode 272 and the NMOS metal gate electrode 274 are formed according to the similar manner as described in reference to FIGS. 13, 14, and 15 with the PMOS gate dielectric 282 and the NMOS gate dielectric 284 at the bottom of the PMOS and NMOS gate openings 252 and 254. Referring to FIG. 20, the insulating material 276 is deposited to encapsulate the PMOS metal oxide gate electrode 272 and the NMOS metal gate electrode 274 according to the similar manner as described in reference to FIG. 16 to prevent contact of the hydrogen gas ($H_2$) with the PMOS metal oxide gate electrode 272 to minimize degradation of the PMOS metal oxide gate electrode 272 during a thermal anneal process having hydrogen gas ($H_2$) flowing through the thermal anneal chamber.

In the alternative embodiment of FIGS. 17, 18, 19, and 20, the PMOS gate dielectric 282 and the NMOS gate dielectric 284 are formed after the thermal anneal process for activating dopant within the drain and source junctions and after the silicidation process for forming the drain and source silicides which may use relatively high temperatures above about 1000° Celsius for example. Such relatively high temperatures may degrade a gate dielectric comprised of a high dielectric constant material. Thus, the PMOS dummy gate dielectric 222 and the NMOS dummy gate dielectric 226 comprised of silicon dioxide ($SiO_2$) are used during such processes that use relatively high temperatures. The PMOS gate dielectric 282 and the NMOS gate dielectric 284 comprised of the high dielectric constant material are formed after such processes that use relatively high temperatures to preserve the integrity of the PMOS gate dielectric 282 and the NMOS gate dielectric 284 comprised of the high dielectric constant material.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "side," "top," and "on" as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for fabricating a PMOS (P-channel Metal Oxide Semiconductor) field effect transistor on a semiconductor substrate, the method including the steps of:

A. depositing a layer of gate dielectric material on said semiconductor substrate;

B. depositing a layer of dummy gate electrode material on said layer of gate dielectric material;

C. patterning said layer of gate dielectric material and said layer of dummy gate electrode material over a first active device area of said semiconductor substrate to form a PMOS (P-channel Metal Oxide Semiconductor) gate dielectric from said gate dielectric material and to form a PMOS (P-channel Metal Oxide Semiconductor) dummy gate electrode from said dummy gate electrode material;

D. implanting a drain and source P-type dopant into exposed regions of said first active device area of said semiconductor substrate to form a PMOS (P-channel Metal Oxide Semiconductor) drain junction and a PMOS (P-channel Metal Oxide Semiconductor) source junction;

E. performing a thermal anneal to activate said drain and source P-type dopant within said PMOS drain and source junctions;

F. forming a PMOS (P-channel Metal Oxide Semiconductor) drain silicide with said PMOS drain junction and a PMOS (P-channel Metal Oxide Semiconductor) source silicide with said PMOS source junction;

G. depositing an insulating material to surround said PMOS dummy gate electrode and said PMOS gate dielectric;

H. etching away said PMOS dummy gate electrode to form a PMOS (P-channel Metal Oxide Semiconductor) gate electrode opening surrounded by said insulating material; and I. filling said PMOS gate electrode opening with a metal oxide material to form a PMOS metal oxide gate electrode.

2. The method of claim 1, further including the steps of:

depositing an insulating material on top of said PMOS metal oxide gate electrode to encapsulate said PMOS metal oxide gate electrode; and performing a thermal anneal with hydrogen gas after said PMOS metal oxide gate electrode is encapsulated to prevent exposure of said PMOS metal oxide gate electrode to hydrogen.

3. The method of claim 2, wherein said insulating material encapsulating said PMOS metal oxide gate electrode is comprised of silicon dioxide ($SiO_2$).

4. The method of claim 1, wherein said PMOS metal oxide gate electrode is comprised of one of ruthenium oxide ($RuO_2$) or iridium oxide ($IrO_2$).

5. The method of claim 1, wherein said gate dielectric material has a dielectric constant higher than that of silicon dioxide ($SiO_2$).

6. The method of claim 1, wherein said dummy gate electrode material is comprised of silicon nitride ($Si_3N_4$).

7. The method of claim 1, wherein said layer of gate dielectric material is comprised of a dummy gate dielectric material, and wherein said method further includes the steps of:

etching away said gate dielectric comprised of said dummy gate dielectric material at a bottom of said gate electrode opening such that said semiconductor substrate is exposed at the bottom of said gate electrode opening, after said step H and before said step I; and depositing a gate dielectric material having a dielectric constant higher than that of silicon dioxide ($SiO_2$) on said semiconductor substrate at the bottom of said gate electrode opening to form said PMOS gate dielectric, before said step I.

8. The method of claim 7, wherein said dummy gate dielectric material is comprised of silicon dioxide ($SiO_2$).

9. The method of claim 1, further including the step of:

forming spacers comprised of an insulating material at sidewalls of said gate electrode opening before said step I.

10. The method of claim 1, wherein said step E of performing said thermal anneal to activate said drain and source P-type dopant within said PMOS drain and source junctions uses a temperature higher than about 1000° Celsius.

11. The method of claim 1, wherein said step of forming said PMOS drain silicide and said PMOS source silicide uses a temperature higher than about 1000° Celsius.

12. The method of claim 1, wherein said step G further includes the steps of:

conformally depositing said insulating material comprised of silicon dioxide ($SiO_2$) to cover said dummy gate electrode; and polishing down said insulating material comprised of silicon dioxide ($SiO_2$) until said dummy gate electrode is exposed.

13. The method of claim 1, further including the steps of:

patterning said layer of gate dielectric material and said layer of dummy gate electrode material over a second active device area of said semiconductor substrate to form an NMOS (N-channel Metal Oxide Semiconductor) gate dielectric from said gate dielectric material and to form an NMOS (N-channel Metal Oxide Semiconductor) dummy gate electrode from said dummy gate electrode material;

implanting a drain and source N-type dopant into exposed regions of said second active device area of said semiconductor substrate to form an NMOS (N-channel Metal Oxide Semiconductor) drain junction and an NMOS (N-channel Metal Oxide Semiconductor) source junction;

performing a thermal anneal to activate said drain and source N-type dopant within said NMOS drain and source junctions before said step I;

forming an NMOS (N-channel Metal Oxide Semiconductor) drain silicide with said NMOS drain junction and an NMOS (N-channel Metal Oxide Semiconductor) source silicide with said NMOS source junction before said step I;

depositing an insulating material to surround said NMOS dummy gate electrode and said NMOS gate dielectric;

etching away said NMOS dummy gate electrode to form an NMOS (N-channel Metal Oxide Semiconductor) gate electrode opening surrounded by said insulating material; and filling said NMOS gate electrode opening with a metal material to form an NMOS metal gate electrode.

14. The method of claim 13, wherein said NMOS metal gate electrode is comprised of one of aluminum, molybdenum, platinum, or tantalum.

15. A method for fabricating a PMOS (P-channel Metal Oxide Semiconductor) field effect transistor and an NMOS (N-channel Metal Oxide Semiconductor) field effect transistor on a semiconductor substrate, the method including the steps of:

A. depositing a layer of dummy gate dielectric material comprised of silicon dioxide ($SiO_2$) on said semiconductor substrate;

B. depositing a layer of dummy gate electrode material comprised of silicon nitride ($Si_3N_4$) on said layer of dummy gate dielectric material;

C. patterning said layer of dummy gate dielectric material and said layer of dummy gate electrode material over a first active device area of said semiconductor substrate to form a PMOS (P-channel Metal Oxide Semiconductor) dummy gate dielectric from said dummy gate dielectric material and to form a PMOS (P-channel Metal Oxide Semiconductor) dummy gate electrode from said dummy gate electrode material;

D. patterning said layer of dummy gate dielectric material and said layer of dummy gate electrode material over a second active device area of said semiconductor substrate to form an NMOS (N-channel Metal Oxide Semiconductor) dummy gate dielectric from said dummy gate dielectric material and to form an NMOS (N-channel Metal Oxide Semiconductor) dummy gate electrode from said dummy gate electrode material;

E. implanting a drain and source P-type dopant into exposed regions of said first active device area of said semiconductor substrate to form a PMOS (P-channel Metal Oxide Semiconductor) drain junction and a PMOS (P-channel Metal Oxide Semiconductor) source junction;

F. implanting a drain and source N-type dopant into exposed regions of said second active device area of said semiconductor substrate to form an NMOS (N-channel Metal Oxide Semiconductor) drain junction and an NMOS (N-channel Metal Oxide Semiconductor) source junction;

G. performing a thermal anneal using a temperature higher than about 1000° Celsius to activate said drain and source P-type dopant within said PMOS drain and source junctions, and to active said drain and source N-type dopant within said NMOS drain and source junctions;

H. forming a PMOS (P-channel Metal Oxide Semiconductor) drain silicide with said PMOS drain junction and a PMOS (P-channel Metal Oxide Semiconductor) source silicide with said PMOS source junction, using a temperature higher than about 1000° Celsius;

I. forming an NMOS (N-channel Metal Oxide Semiconductor) drain silicide with said NMOS drain junction and an NMOS (N-channel Metal Oxide Semiconductor) source silicide with said NMOS source junction, using a temperature higher than about 1000°0 Celsius;

J. conformally depositing an insulating material comprised of silicon dioxide ($SiO_2$) to cover said PMOS dummy gate electrode and said PMOS dummy gate dielectric and to cover said NMOS dummy gate electrode and said NMOS dummy gate dielectric;

K. polishing down said insulating material comprised of silicon dioxide ($SiO_2$) until said PMOS dummy gate electrode and said NMOS dummy gate electrode are exposed;

L. etching away said PMOS dummy gate electrode to form a PMOS (P-channel Metal Oxide Semiconductor) gate electrode opening surrounded by said insulating material;

M. etching away said NMOS dummy gate electrode to form an NMOS (N-channel Metal Oxide Semiconductor) gate electrode opening surrounded by said insulating material;

N. etching away said PMOS dummy gate dielectric comprised of said dummy gate dielectric material at a bottom of said PMOS gate electrode opening such that said semiconductor substrate is exposed at the bottom of said PMOS gate electrode opening;

O. depositing a gate dielectric material having a dielectric constant higher than that of silicon dioxide ($SiO_2$) on said semiconductor substrate at the bottom of said PMOS gate electrode opening to form a PMOS gate dielectric;

P. etching away said NMOS dummy gate dielectric comprised of said dummy gate dielectric material at a bottom of said NMOS gate electrode opening such that said semiconductor substrate is exposed at the bottom of said NMOS gate electrode opening;

Q. depositing a gate dielectric material having a dielectric constant higher than that of silicon dioxide ($SiO_2$) on said semiconductor substrate at the bottom of said NMOS gate electrode opening to form an NMOS gate dielectric;

R. forming spacers comprised of silicon dioxide ($SiO_2$) at sidewalls of said PMOS gate electrode opening and at sidewalls of said NMOS gate electrode opening;

S. filling said PMOS gate electrode opening with a metal oxide material to form a PMOS metal oxide gate electrode;

wherein said PMOS metal oxide gate electrode is comprised of one of ruthenium oxide ($RuO_2$) or iridium oxide ($IrO_2$);

T. filling said NMOS gate electrode opening with a metal material to form an NMOS metal gate electrode;

wherein said NMOS metal gate electrode is comprised of one of aluminum, molybdenum, platinum, or tantalum;

U. depositing an insulating material comprised of silicon dioxide ($SiO_2$) on top of said PMOS metal oxide gate electrode and said NMOS metal gate electrode to encapsulate said PMOS metal oxide gate electrode and said NMOS metal gate electrode; and V. performing a thermal anneal with hydrogen gas after said PMOS metal oxide gate electrode and said NMOS metal gate electrode are encapsulated to prevent exposure of said PMOS metal oxide gate electrode and said NMOS metal gate electrode to hydrogen.

* * * * *